United States Patent [19]
Sur, Jr. et al.

[11] Patent Number: 5,854,510
[45] Date of Patent: Dec. 29, 1998

[54] LOW POWER PROGRAMMABLE FUSE STRUCTURES

[75] Inventors: Harlan Lee Sur, Jr., San Leandro; Subhas Bothra, San Jose; Xi-Wei Lin, Fremont; Martin H. Manley, Saratoga; Robert Payne, San Jose, all of Calif.

[73] Assignee: VLSI Technology, Inc., San Jose, Calif.

[21] Appl. No.: 883,403

[22] Filed: Jun. 26, 1997

Related U.S. Application Data

[63] Continuation-in-part of Ser. No. 774,036, Dec. 27, 1996.
[51] Int. Cl.⁶ .............................. H01L 27/10; H01L 29/00
[52] U.S. Cl. .......................... 257/529; 257/208; 257/209; 257/528
[58] Field of Search .................................. 257/208, 209, 257/528, 529

[56] References Cited

U.S. PATENT DOCUMENTS

| | | | |
|---|---|---|---|
| 3,792,319 | 2/1974 | Tsang | 317/235 R |
| 4,042,950 | 8/1977 | Price | 357/51 |
| 5,025,298 | 6/1991 | Fay et al. | 257/529 |

OTHER PUBLICATIONS

L. Van Den Hove, "*Advanced Interconnection and Contact Schemes Based on TiSi$_2$ and CoSi$_2$ : Relevant Materials Issues and Technological Implementation*", Katholieke Universiteit Leuven, IMEC, pp. 144–153, Jun. 1988.

*Primary Examiner*—Valencia Martin Wallace
*Attorney, Agent, or Firm*—Hickman & Martine, LLP

[57] ABSTRACT

Disclosed is a semiconductor fuse structure having a low power programming threshold and anti-reverse engineering characteristics. The fuse structure includes a substrate having a field oxide region. A polysilicon strip that has an increased dopant concentration region lies over the field oxide region. The fuse structure further includes a silicided metallization layer having first and second regions lying over the polysilicon strip. The first region has a first thickness, and the second region has a second thickness that is less than the first thickness and is positioned substantially over the increased dopant concentration region of the polysilicon strip. Preferably, the first region of the silicided metallization layer has a first side and a second side located on opposite sides of the second region, and the resulting fuse structure is substantially rectangular in shape. Therefore, the semiconductor fuse structure can be programmed by breaking the second region.

24 Claims, 7 Drawing Sheets

LOW POWER PROGRAMMABLE FUSE STRUCTURES

CROSS REFERENCE TO RELATED APPLICATIONS

This application is a continuation-in-part of pending U.S. patent application Ser. No. 08/774,036 (Attorney Docket No. VLSI 2783) filed Dec. 27 1996, entitled "BI-LAYER PROGRAMMABLE RESISTOR", and naming Martin Harold Manley and Robert Payne as inventors. The contents of this pending application are incorporated herein by reference for all purposes.

BACKGROUND OF THE INVENTION

1. Field of the Invention

The present invention relates generally to semiconductor circuits and, more particularly, to a method of forming low power programmable elements, and semiconductor devices including low power programmable elements formed by such method.

2. Description of the Related Art

There are a significant number of integrated circuit applications that require some sort of electrically programmable memory for storing information. The information stored varies widely in size ranging from a few bits used to program simple identification data, to several megabits used to program computer operating code. To accommodate the increased demand for electrically programmable memory in modern integrated circuits, a number of well known memory technologies that include, for example, programmable read only memories (PROMs), erasable programmable read-only memories (EPROMs), electrically erasable programmable read-only memories (EPROMs), field programmable gate arrays (FPGAs), and antifuse devices have been readily used. However, fabricating these types of memory devices along with core logic integrated circuitry adds a number of additional processing steps that unfortunately drive up product costs. The additional product costs are often times difficult to justify when only relatively small amounts of electrically programmable elements are needed for a particular integrated circuit application.

To reduce costs, semiconductor designers have been implementing "fuse" structures that are made out of existing doped polysilicon layers that are typically patterned to define transistor gates over a semiconductor structure. Once formed, the fuse structure may be "programmed" by passing a sufficiently high current that melts and vaporizes a portion of the polysilicon fuse. In the programmed state, the fuse structure typically has a resistance that is substantially greater than the non-programmed state, thereby producing an open circuit. This is of course counter to antifuse devices that become short circuits (i.e., substantially decreased resistance) in a programmed state. Although traditional fuse structures work well, they typically consume a large amount of power in programming that may make them unfit for a variety of low power integrated circuit products.

For example, the power dissipated in programming a fuse structure is given by the expression $V^2/R$, where V is the voltage applied to the fuse, and R is the resistance. As is well known, the applied voltage must be sufficiently large in order to cause a programming event (e.g., produce an open circuit) in the doped polysilicon fuse structure. Oftentimes, these voltage levels may be larger than the power supplies used by many advanced integrated circuits.

Besides consuming substantial amounts of power to cause the doped polysilicon fuse structure to be programmed, special high voltage transistors are typically designed routed and interconnected over the semiconductor chip itself to direct the increased programming voltages to selected fuses. Consequently, the special high voltage transistors occupy additional chip surface area, thereby causing an increase in chip dimensions, and thereby increasing product costs.

Further, fuse technology has been gaining increased popularity in a variety of consumer electronics, that store confidential information such as pin numbers, bank account numbers, social security numbers and other confidential information directly on a chip. Because this type of information is of such confidential nature, it is critical that such integrated products having fuse programmed data be difficult to reverse engineer. However, a number of fuse structures having distinct advantages are patterned in distinguishing "bow-tie" shapes to facilitate programming in the vicinity of a narrow neck area. For more information on the advantages of bow-tie shaped fuse structures, reference may be made to co-pending U.S. patent application Ser. No. 08/774,036, which is incorporated by reference herein. Although the narrow neck area facilitates programming, it also makes fuse detection rather straight forward for persons attempting to reverse engineer the fuse structures to illegally gain access to confidential information programmed therein.

Accordingly, in view of the foregoing, there is a need for a method of fabricating fuse structures that utilize relatively small amounts of programming power and are difficult to identify during improper reverse engineering attempts.

SUMMARY OF THE INVENTION

Broadly speaking, the present invention fills these needs by providing a fuse structure and method for making a fuse structure that has low programming power consumption characteristics and is difficult to distinguish from other semiconductor features patterned over a semiconductor die. It should be appreciated that the present invention can be implemented in numerous ways, including as a process, an apparatus, a system, a device, or a method. Several inventive embodiments of the present invention are described below.

In one embodiment, a semiconductor fuse structure having a low power programming threshold is disclosed. The fuse structure includes a substrate having a field oxide region. A polysilicon strip that has an increased dopant concentration region that lies over the field oxide region. The fuse structure further includes a silicided metallization layer having first and second regions lying over the polysilicon strip. The first region has a first thickness, and the second region has a second thickness that is less than the first thickness and is positioned substantially over the increased dopant concentration region of the polysilicon strip. Preferably, the first region of the silicided metallization layer has a first side and a second side located on opposite sides of the second region, and the resulting fuse structure is substantially rectangular in shape.

Therefore, the semiconductor fuse structure can be programmed by breaking (e.g., vaporizing) the second region.

In another embodiment, a bi-layer semiconductor fuse structure is disclosed. The bi-layer semiconductor fuse structure includes a substrate having a field oxide region, and a polysilicon strip lying over the field oxide region. The fuse structure also includes a silicided metallization layer having first and second regions lying over the polysilicon strip such that the first region has a first thickness that is approximately centered about the polysilicon strip. The second region has a second thickness that is less than the first thickness and is position on adjacent sides of the first region.

Preferably, the bi-layer semiconductor fuse structure can be programmed by applying a short pulse width having a low voltage that vaporizes the first thickness to produce a substantial open circuit, and the doped polysilicon strip is substantially rectangular in shape.

In yet another embodiment, a method of making a low power programmable fuse structure is disclosed. The method includes providing a substrate having a field oxide region. Forming a doped polysilicon strip over the field oxide region. Forming a mask over the doped polysilicon strip such that a window exposing the doped polysilicon strip is defined at about the center of the doped polysilicon strip. Applying an increased implant dose over the mask and the exposed doped polysilicon strip lying within the window to produce an increased dopant concentration region in the doped polysilicon strip. The increased implant dose being between about $3 \times 10^{15}$ cm$^{-2}$ and about $6 \times 10^{15}$ atoms cm$^{-2}$. The method further includes forming a silicide metal over the doped polysilicon strip such that a thinner layer of the silicide metal is formed over the increased dopant concentration region and a thicker layer of the silicide metal is formed over other regions of the polysilicon strip.

In still another embodiment, a method of making a low power programmable fuse structure is disclosed. The method includes providing a substrate having a field oxide region. Forming a doped polysilicon strip over the field oxide region. Forming a silicide metal over the doped polysilicon strip. Forming a mask over the silicide metal such that a mask window exposing the silicide metal is defined at about the center of the silicide metal that overlies the doped polysilicon strip. The method further includes etching the exposed silicide metal lying within the mask window to produce a thinner region in the silicide metal at about the center of the silicide metal that overlies the doped polysilicon.

Advantageously, the thinner region in the bi-layer fuse structure enables programming of the fuse structure with substantially less power than prior art designs. For example, substantially low voltages may be used to program the fuse structure and much shorter pulse widths may be used to cause the open circuit programming of the fuse structure. Furthermore, because fuse structures are more frequently being used to store highly confidential data (e.g., in smart cards, bank cards, etc.), it is very important that the reverse engineering of programmed fuse structures be made as difficult as possible. Advantageously, the layout geometries of the fuse structures of the present invention are substantially similar to a number of other very common semiconductor device features, which may include for example, transistor gates, device interconnect jumpers, or even metallization routing lines. As such, because identifying which geometries are or are not fuse structures on a semiconductor chip is the critical step in reverse engineering the programmed data, reverse engineering semiconductor chips for the purpose of illegally ascertaining confidential data will become too costly for the unscrupulous. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

An invention for a fuse structure and method for making a fuse structure that has low power consumption characteristics and is difficult to distinguish from other semiconductor features patterned over a semiconductor die is enclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

The present invention is directed at a low power programming bi-layer fuse structure having a base polysilicon layer and an overlying silicided layer that includes a region that is thinner than the rest of the overlying silicided layer. In one embodiment, to form the overlying silicided layer having the thinner region, a window exposing the base polysilicon layer is defined in a photoresist mask to subject the exposed base polysilicon layer to an increased dopant concentration. The increased dopant concentration in the exposed base polysilicon layer therefore slows down the formation of silicide over increased dopant concentration region. As a result, the overlying silicide layer has a region that is thinner over the increased dopant concentration region and thicker over opposite sides of the thinner region. This thinner region will therefore facilitate programming of the fuse structure with substantially less power consumption.

In another embodiment, the silicided layer that overlies the base polysilicon layer is pattered with a photoresist mask exposing a region over the silicide layer. The exposed region is then subjected to timed etch configured to remove about half the thickness of the silicided layer. As in the first embodiment, the thinner silicided region produced by etching will enable programming of the fuse structure with substantially less power consumption. Furthermore, the fuse structure shape is preferably a rectangular strip that resembles a semiconductor transistor gate, jumper or interconnect line. As a result, the fuse structure is generally difficult to distinguish from other feature geometries on a semiconductor chip, which advantageously impedes reverse engineering attempts of confidential data programmed into the fuse structures.

Figure 1:
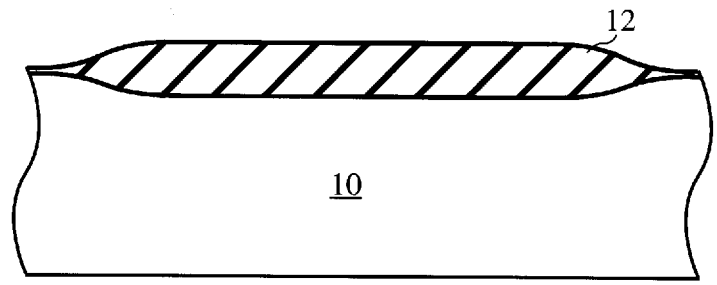
FIG. 1 is a cross sectional view of a semiconductor substrate having a field oxide layer formed over a portion of semiconductor substrate in accordance with one embodiment of the present invention.
Figure 2:
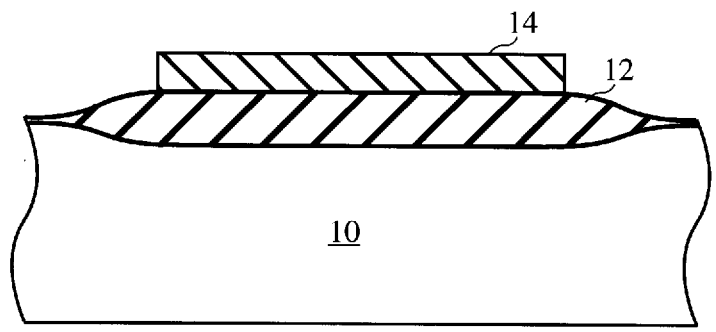
FIG. 2 shows the cross sectional view of FIG. 1 after a polysilicon strip of a bi-layer fuse structure is formed in accordance with one embodiment of the present invention.

FIG. 1 is a cross sectional view of a semiconductor substrate 10 having a field oxide layer 12 formed over a portion of semiconductor substrate 10 in accordance with one embodiment of the present invention. Although only a cross sectional view of a field oxide layer 12 is shown over semiconductor substrate 10 for ease of discussion, it should be apparent to one of skill in the art that a multitude of devices are typically fabricated throughout the same semiconductor substrate 10. As shown in FIG. 2, a polysilicon strip 14 that defines the base layer of a bi-layer fuse structure is formed over field oxide 12.

In this embodiment, the polysilicon strip 14 preferably has a thickness of between about 1000 angstroms and about 3000 angstroms, and more preferably between about 1500 angstroms and about 2500 angstroms, and most preferably about 2000 angstroms. Further, polysilicon strip 14 is preferably doped with an arsenic (As) implant dose of between about $1 \times 10^{14}$ cm$^{-2}$ and about $1 \times 10^{15}$ cm$^{-2}$. Therefore, the dopant concentration is preferably between about $1 \times 10^{19}$ atoms cm$^{-3}$ and about $1 \times 10^{20}$ atoms cm$^{-3}$. Although differing dopant concentrations will typically cause variations in sheet resistance, the sheet resistance of the doped polysilicon strip 14 will preferably range between about 35 ohms per square and 100 ohms per square. Furthermore, it should be understood that the polysilicon strip 14 may be doped with any suitable n-type impurity including phosphorous and arsenic, or any suitable p-type impurity including Boron.

Although the fuse structure of the present invention may be formed at any stage in processing, the polysilicon strip 14 is preferably patterned from the same layer used to form polysilicon transistor gates, polysilicon jumpers, or polysilicon resistors throughout a semiconductor chip. In this manner, when fuse structures are desired in a particular application, the polysilicon strip 14 may be patterned over field oxide 12 of the semiconductor substrate 10. Although any geometric shape having one side that is longer than the other may be used, polysilicon strip 12 (that defines the first layer of the bi-layer fuse) is preferably designed to have a rectangular shape that may be similar to the shapes of other common features patterned over the surface of semiconductor substrate 10. Because polysilicon strip 14 is preferably not bow-tie shaped, its detection will be rather difficult during possibly illegal reverse engineering attempts at decoding confidential information programmed in the fuse structures. Further, the fabrication of the fuse structures of the present invention are advantageously formed at a lower fabrication cost because they are preferably formed from the same layers used to define transistors in an integrated circuit design.

Figure 3:
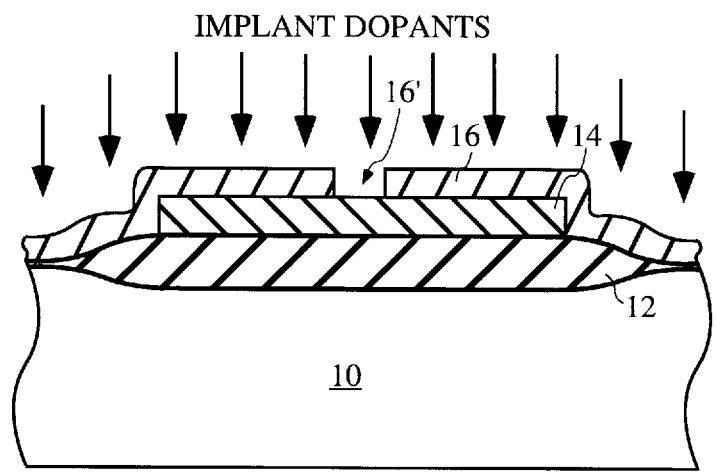
FIG. 3 shows the cross sectional view of FIG. 2 after a photoresist layer is applied and patterned over field oxide layer and polysilicon strip, and an implant operation is performed in accordance with one embodiment of the present invention.
Figure 6:
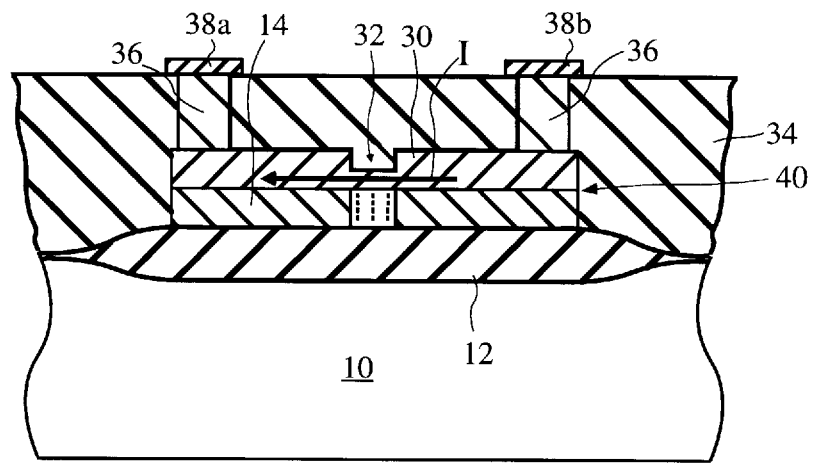
FIG. 6 is a cross sectional view of the fabricated bi-layer fuse structure after an intermetal oxide and contacts are formed in accordance with one embodiment of the present invention.

FIG. 3 shows a cross sectional view of FIG. 2 after a photoresist layer 16 is applied and patterned over field oxide layer 12 and polysilicon strip 14 in accordance with one embodiment of the present invention. In general, a window 16' is defined in photoresist layer 16 using conventional photolithography patterning techniques to expose a region the underlying polysilicon strip 14. In this embodiment, the window 16' is preferably defined at about a center location of the polysilicon strip 14 to enable conductive vias to be subsequently formed down to each end of the bi-layer fuse structure as shown in FIG. 6 below. Once the window 16' is defined, a high implantation dose is applied, such that the polysilicon strip 14 is implanted with an increased dopant concentration in the area defined by window 16'. In this embodiment, arsenic (As) atoms having an implant dose of between about $3 \times 10^{15}$ cm$^{-2}$ and about $6 \times 10^{15}$ cm$^{-2}$ is preferably implanted, thereby producing a dopant concentration of between about $3 \times 10^{20}$ atoms cm$^{-3}$ and about $1 \times 10^{21}$ atoms cm$^{-3}$ in the polysilicon strip 14 lying within window 16'.

Figure 4:
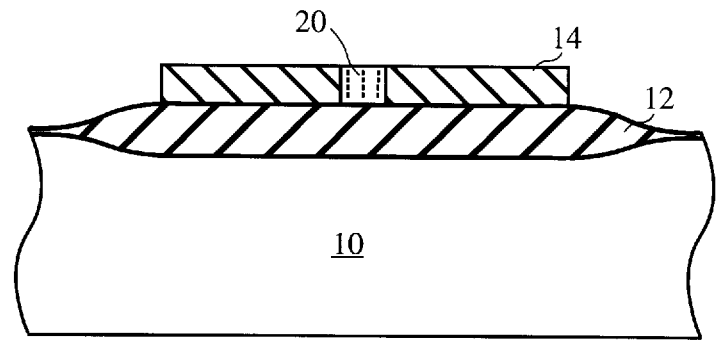
FIG. 4 shows the cross sectional view of FIG. 3 after the implant operation, and after the photoresist layer has been removed in accordance with one embodiment of the present invention.
Figure 5A:
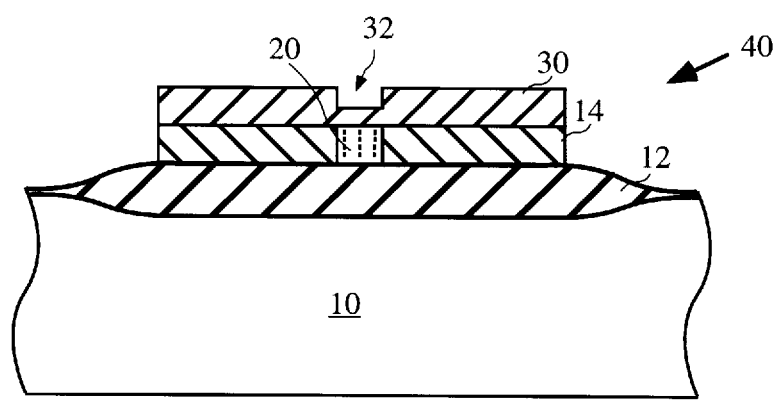
FIG. 5A shows the cross sectional view of FIG. 4 after a silicide layer is formed over polysilicon strip producing a thinner region of silicide in the bi-layer fuse structure in accordance with one embodiment of the present invention.

FIG. 4 shows a cross sectional view of semiconductor substrate 10 having polysilicon strip 14 after the photoresist layer 16 has been removed in accordance with one embodiment of the present invention. As shown, an increased dopant concentration region 20 is produced substantially near a center region of the polysilicon strip 14, a silicide layer 30 is formed over polysilicon strip 14 as shown in FIG. 5A. The resulting silicided layer 30 therefore includes a thin silicide region 32 lying over the increased dopant concentration region 20. The thin silicide region 32 is primarily due to the fact that silicide metals are formed at reduced rates over regions of increased dopant concentration.

As such, because the dopant concentration is lower in the polysilicon material that lies on either side of the increased dopant concentration region 20, the thickness of the silicide layer 30 is shown to be greater on either side. In a preferred embodiment, the thickness of the silicide layer 30 over the increased dopant concentration region 20 is about half as thick as the silicide layer 30 lying on either side. As mentioned earlier, the thinner silicide region advantageously reduces the amount of power needed to generate sufficient heat to cause a resulting bi-layer fuse structure 40 to be programmed.

In one embodiment, the preferred metallization deposited to form the silicide layer 30 is titanium (Ti), thereby forming TiSi$_2$, although other suitable metallizations may be used. For example, others include Tungsten (W), Cobalt (Co), Nickel (Ni), Tantalum (Ta), Chromium (Cr), and Molybdenum (Mo) to form $WSi_2$, $CoSi_2$, $NiSi$, $TaSi_2$, $CrSi_2$, and $MoSi_2$, respectively. Therefore, in a preferred embodiment, silicide layer 30 is formed by initially depositing titanium to a thickness of between about 250 angstroms and about 1000 angstroms, and more preferably between about 350 angstroms and about 650 angstroms, and most preferably about 500 angstroms.

Once deposited, the substrate is subjected to a rapid thermal anneal ($RTA_1$) which exposes the entire wafer to a temperature of about 700 degrees Celsius for about 30 seconds to allow most of the titanium that is in close contact with polysilicon strip 14 to fuse into the silicon layer, thereby producing a layer of titanium silicide ($TiSi_2$). Once the silicided layer 30 is produced over polysilicon strip 14, a wet etch that includes water ($H_2O$): hydrogen peroxide ($H_2O_2$): ammonium hydroxide ($NH_4OH$) in a preferred ratio of about 5:1:1 is performed. In general, the wet etch is well suited to selectively etch away any unreacted titanium lying over a lower silicide layer 30 (i.e., $TiSi_2$). It should be noted that no silicide is formed over the field oxide region 12 because oxide is not susceptible to the silicided process.

Next, the substrate is subjected to a second rapid thermal anneal ($RTA_2$) at a higher temperature ranging up to about 1000 degrees Celsius to assist in transforming the silicide layer 30 into a low resistive atomic phase. By way of example, after the second rapid thermal anneal, the sheet resistance of silicide layer 30 may be between about 1.5 ohms per square and about 14 ohms per square. As is well known, designers are able to design varying valued resistor structures by patterning layers in a variety of different shapes designed to fit well within a particular design layout. By way of example, the resistance "R" of a patterned shape is determined by multiplying the ratio of ("length"/"width") by the resistivity expressed in terms of sheet resistance (i.e., $R=[(L/W)\square*\Omega/\square]=\Omega$).

In one embodiment, the remaining layer of titanium silicide, after the silicide process, has a thickness of between about 250 angstroms and about 1000 angstroms, and more preferably between about 350 angstroms and about 650 angstroms, and most preferably about 500 angstroms. As such, the preferred thickness of the thin silicide region 32 is between about 125 angstroms and about 500 angstroms, and more preferably between about 175 angstroms and about 325 angstroms, and most preferably about 250 angstroms.

Figure 5B:
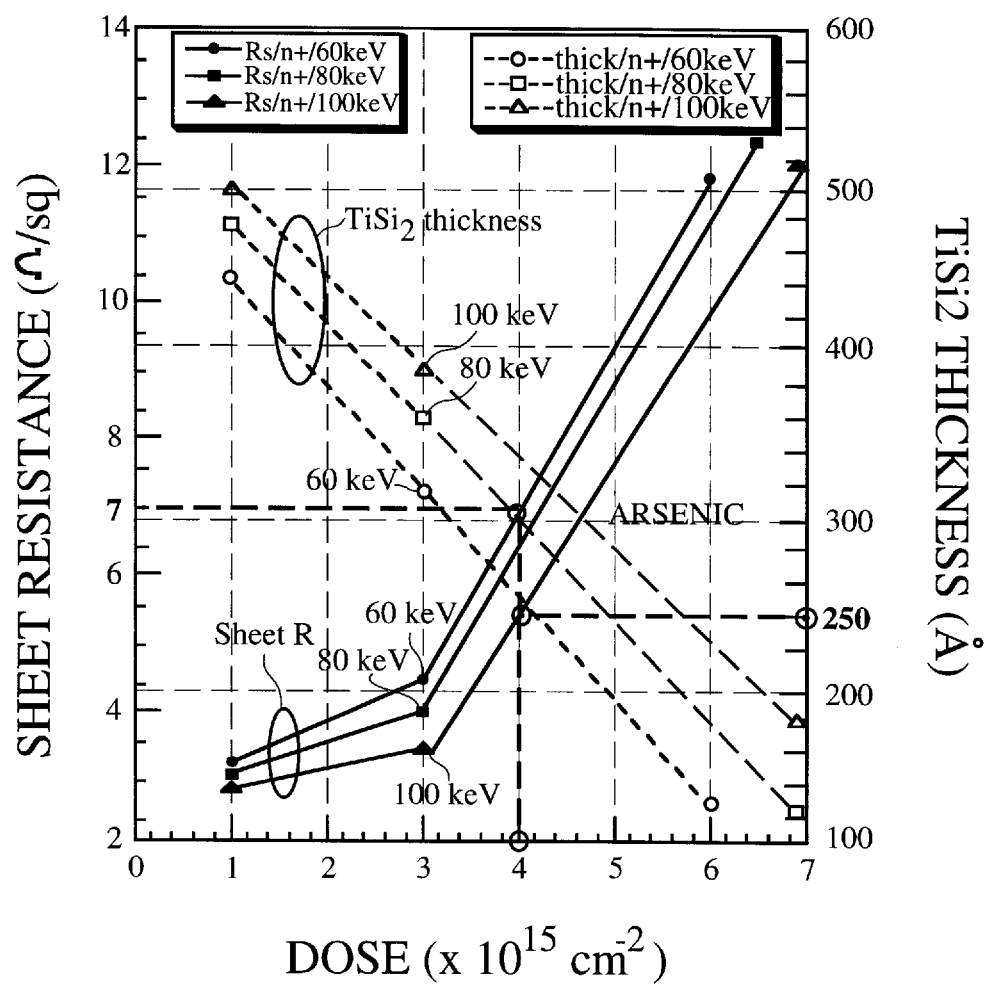
FIG. 5B is a graph illustrating experimental data confirming the response of the thickness of the silicide layer with respect to the applied impurity doses in accordance with one embodiment of the present invention.

FIG. 5B is a graph illustrating experimental data confirming the response of the thickness (i.e., broken lines) of the silicide layer 30 over layers having a range of applied impurity doses in accordance with one embodiment of the present invention. This graph also experimentally illustrates the variation of sheet resistance (i.e., solid lines) over the same range of impurity doses. As shown, when the applied impurity dose is varied from about $3\times10^{15}$ $cm^{-2}$ to about $6\times10^{15}$ $cm^{-2}$, the titanium, silicide thickness decreases, thereby enabling precise generation of the thin silicided region 32 over the fuse structure 40. In a specific example shown, when an implant dose of about $4\times10^{15}$ $cm^{-2}$ is applied with an implant energy of about 60 keV, the thickness of the titanium silicide layer will approximately be about 250 angstroms. However, over other regions of the polysilicon strip 14, the thickness of the titanium silicide layer will preferably be about twice the thickness of the thin silicided region 32 (e.g., about 500 angstroms), because lower concentration dopants are resident in those areas of the polysilicon strip 14.

The graph also indicates that when higher energies (e.g., about 80 keV and about 100 keV) are used to implant the dopants, the thickness of the silicide increases. It is believed that the higher energy dopants implant the impurities much deeper into the substrate, thereby leaving a lighter concentration near the surface that enables thicker silicide growth. On the other hand, when lower energies are used, more of the impurities are resident closer to the surface, thereby producing thinner silicides. With this in mind, the graph also illustrates with the solid lines that the sheet resistance will generally increase when the dopant impurities are increased. As mentioned above, when impurities are implanted with a dose of about $4\times10^{15}$ $cm^{-2}$ and an energy of about 60 keV, the titanium silicide layer may be about 250 angstroms thick, and therefore the sheet resistance measured from the solid lines will preferably be about 7 ohms per square. It should therefore be understood that the sheet resistance and silicide thickness will vary depending on the implant dose and energy.

FIG. 6 is a cross sectional view of the fuse structure 40 after an intermetal oxide 34 has been deposited over the entire surface of the substrate in accordance with one embodiment of the present invention. After the intermetal oxide 34 is deposited, via holes are patterned and etched down to the polysilicon strip 14 at each end of the fuse structure 40. Once the via holes are defined, any suitable metallization fill technique may be used such as a tungsten plug or aluminum fill to complete electrical contacts 36. After electrical contacts 36 are formed, a suitable substrate planarization technique, such as chemical mechanical polishing (CMP) or any other suitable technique, may be used to planarize the substrate. Once planarized, additional metallization interconnect layers may be formed to complete metallization lines 38a and 38b that are electrically connected to contacts 36.

Metallization lines 38a and 38b are therefore used to apply a voltage "V" of between about 1.2 volts and about 3.5 volts, and more preferably a voltage of between about 1.7 volts and about 2.6 volts to cause a current "I" to flow between metallization lines 38a and 38b, primarily through silicided layer 30. In the example of FIG. 6, a current "I" is shown flowing from metallization line 38b to 38a, and therefore, the electrons will flow from metallization line 38a to 38b. Because silicided layer 30 has a sheet resistance that is substantially lower than the underlying polysilicon strip 14, the bulk of the current will be carried by silicide layer 30. Because the current bulk is carried in silicide layer 30, the current generated joule heat will cause a net electromigration of tungsten silicide in the direction of electronic flow.

In a matter of a few microseconds, the migration of tungsten silicide will become so large that a break will occur in the silicide layer 30. In a preferred embodiment, the programming pulse width is between about 100 microseconds and about 500 milliseconds, and more preferably between about 1 millisecond and about 100 milliseconds, and most preferably about 50 milliseconds. Because the applied programming pulse is substantially smaller than the programming pulse widths of typical fuse structures, the power consumed in programming fuse structure in accordance with one embodiment of the present invention is substantially reduced.

Figure 7:
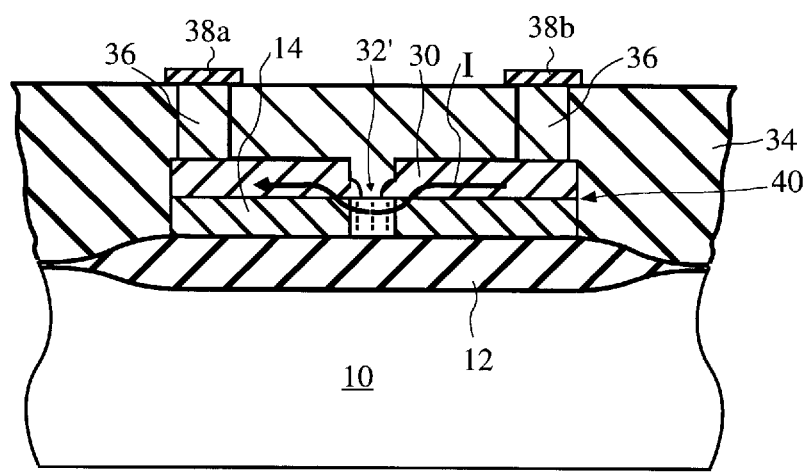
FIG. 7 shows the bi-layer fuse structure after low power programming in accordance with one embodiment of the present invention.

FIG. 7 shows the fuse structure 40 after programming in accordance with one embodiment of the present invention. By way of example, the programmed fuse structure 40 will have a gap 32' in the thinner region of the silicide layer 30. As mentioned earlier, the programming current flow through the thinner region caused the increase in joule heat that vaporized the silicide layer. As pictorially illustrated, once programmed, the current "I" will not longer flow through the low sheet resistive silicide layer 30 due to the gap 32', and will suddenly be forced to flow through a more highly resistive polysilicon strip 14. Because the resistance is substantially higher in the underlying polysilicon strip 14, the fuse structure 40 will respond as an open circuit. It therefore follows that substantially less power is consumed in arriving at a programmed fuse structure state.

Figure 8A:
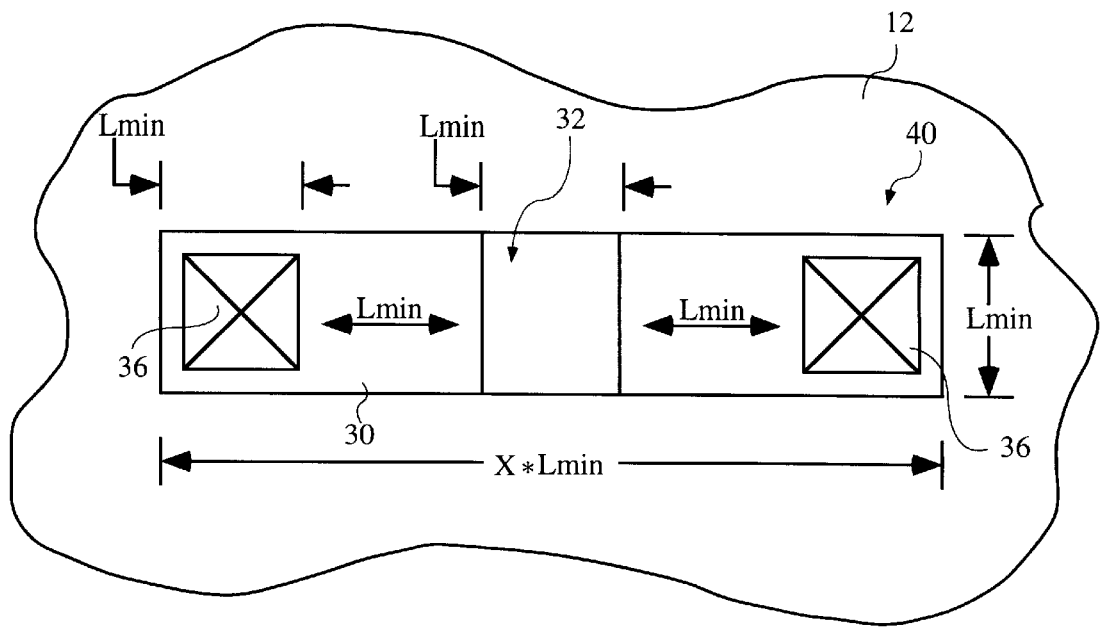
FIGS. 8A and 8B are top views of exemplary bi-layer fuse structure shapes in accordance with one embodiment of the present invention.
Figure 8B:
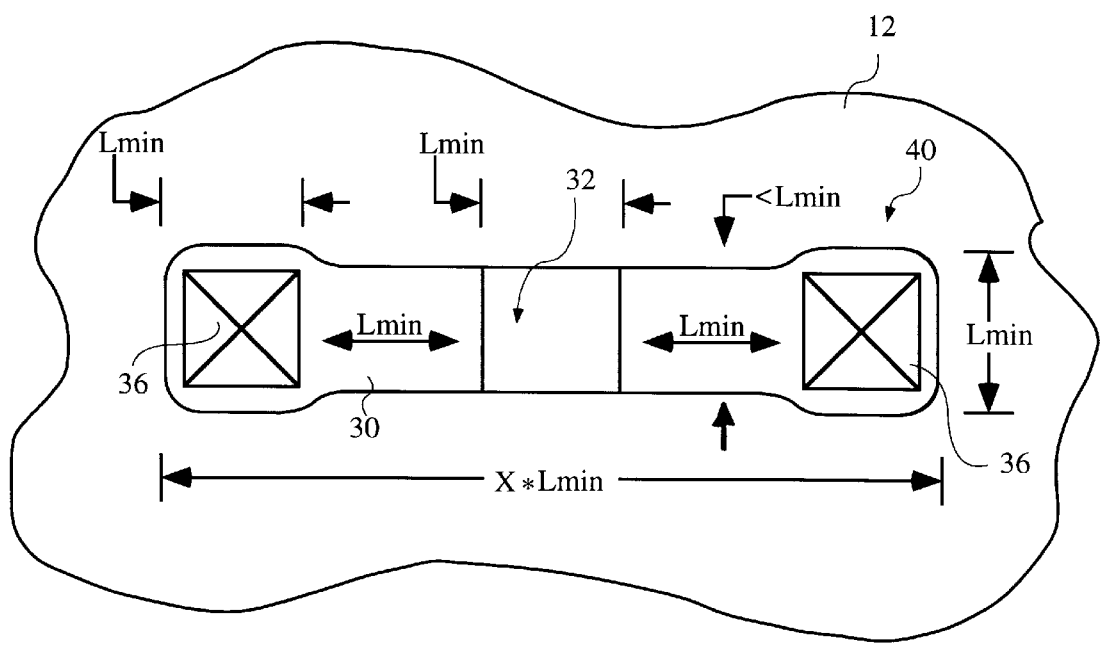

FIG. 8A is a top view of the bi-layer fuse structure 40 formed over field oxide 12 in accordance with one embodiment of the present invention. Preferably fuse structure 40 is substantially rectangular in shape having a longer side that is X*Lmin, where Lmin is between about 700 angstroms and about 20,000 angstroms, and more preferably about 1,500 angstroms and about 5,000 angstroms, and most preferably about 2,500 angstroms. The shorter side of fuse structure 40 is about Lmin, and so is the distance between contacts 36 and the thin silicide region 32. Therefore, the thin silicided region 32 may be square shaped in some embodiments, and in other embodiments, thin silicided region 32 may be rectangular. In any event, the longer side of the fuse structure 40 is about 5*Lmin, where X=5. It should be appreciated that the preferred rectangular shape of fuse structure 40 may have slightly rounded ends and may have a center region that is less than Lmin (i.e.,<Lmin) as shown in FIG. 8B.

Figure 9:
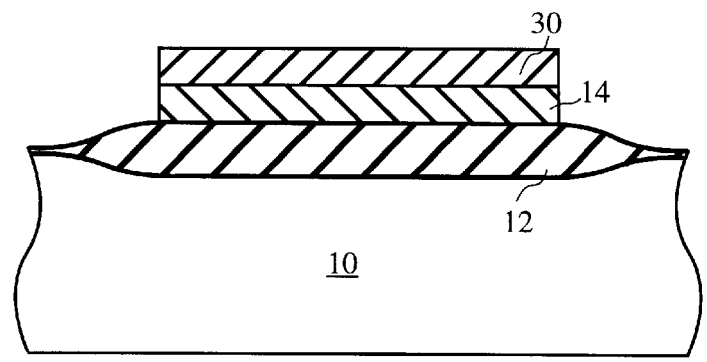
FIG. 9 illustrates a bi-layer fuse structure including a polysilicon strip and an overlying silicide layer in accordance with an alternative embodiment of the present invention.
Figure 10:
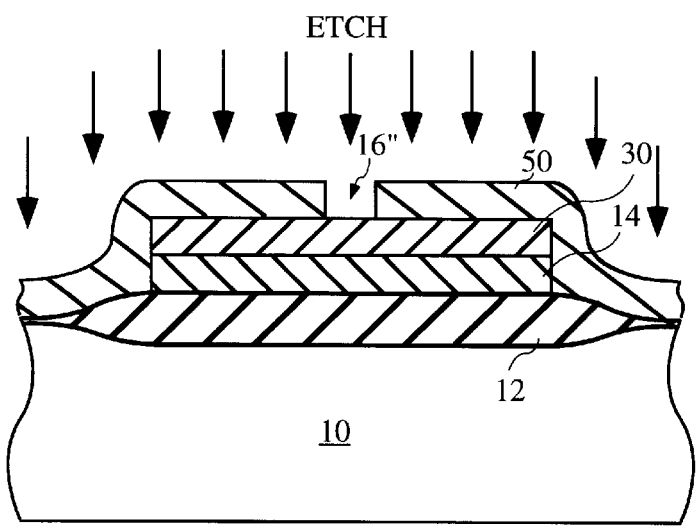
FIG. 10 illustrates a photoresist mask patterned over the silicide layer to define a window to exposes a region of the bi-layer fuse structure in accordance with the alternative embodiment of the present invention.

FIG. 9 illustrates a bi-layer fuse structure including a polysilicon strip 14 and an overlying silicide layer 30 in accordance with an alternative embodiment of the present invention. In this embodiment, the doped polysilicon strip 14 is not masked and doped with an increased concentration before forming the silicide layer 30. However, as shown in FIG. 10, a photoresist mask 50 is patterned over the silicide layer 30 to define a window 16" that preferably exposes a region that lies approximately at the center of the bi-layer fuse structure. Next, a time controlled etch is performed to etch about half the thickness of the silicide layer 30 lying within the window 16" in the photoresist mask 50.

The preferred etchant is a dilute hydrofluoric acid (HF) that has a concentration ratio of between about 125:1 and about 25:1, and more preferably between about 100:1 and about 35:1, and most preferably about 50:1. Therefore, for the most preferred concentration ratio, for every 1 part of HF, 50 parts of deionized water are used. As such, the resulting etch rate will preferably be between about 10 and about 30 angstroms per second, and more preferably, between about 15 and about 25 angstroms per second, and most preferably about 20.5 angstroms per second.

By employing these preferred etch rates, it is possible to control the amount of silicide layer 30 removed from within the window 16". By way of example, if the silicide layer is about 500 angstroms, and the desired thinner region 32 of silicide layer 30 is about 250 angstroms, the etching operation is preferably time controlled to be about 12 seconds. In another example, if the dilute hydrofluoric acid (HF) concentration ratio is about 100:1, the etch rate has been found to be about 15 angstroms per second. Therefore, by decreasing the acid concentration, the etch rate is decreased and more control may be exercised in attaining precise thin regions within the window 16". Of course, other wet etchant chemicals, such as a buffered oxide etch (HF, $NH_3F$) may be used as well for selectively etching other metalization layers. Alternatively, dry plasma etching may also be used to define a precision control etch to define the thinner region 32.

Figure 11:
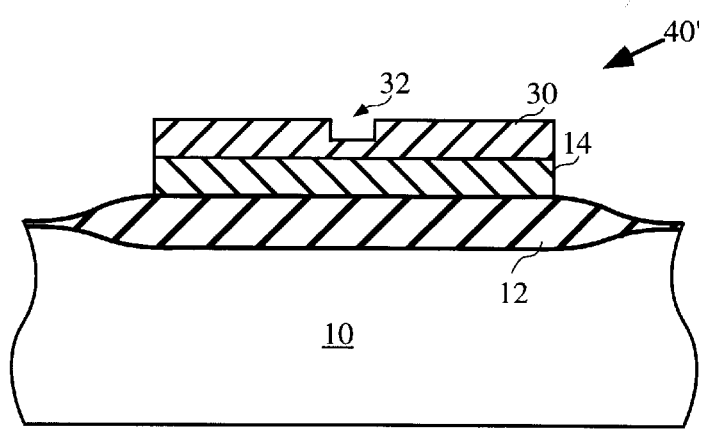
FIG. 11 illustrates the fuse structure of FIG. 10 after the photoresist layer is removed after a timed etching operation is performed in accordance with the alternative embodiment of the present invention.

FIG. 11 illustrates the fuse structure 40' after the photoresist layer 50 is removed after an etching step in accordance with the alternative embodiment of the present invention. As in the embodiment of FIG. 5A, a thin silicided region 32 results with thicker silicided regions on either side of the thin region. Having this thinner region therefore enable programming of the fuse structure 40' with substantially less power than conventional fuse structures.

Figure 12:
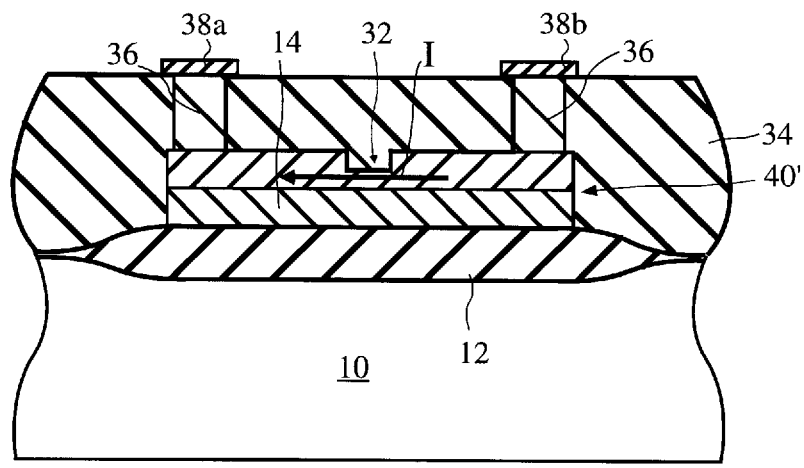
FIG. 12 illustrates the final fuse structure after contacts are connected to each respective side of the silicide layer of the bi-layer fuse structure in accordance with the alternative embodiment of the present invention.
Figure 13:
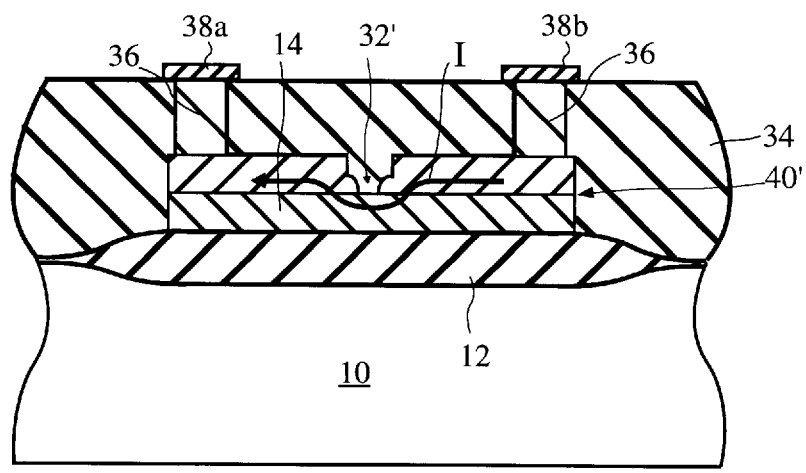
FIG. 13 shows the bi-layer fuse structure after low power programming in accordance with the alternative embodiment of the present invention.

FIG. 12 illustrates the final fuse structure 40' having contacts 36 connected to each respective side of the silicide layer 30 in accordance with the alternative embodiment of the present invention. Therefore, as described above with reference to FIG. 6, the bulk of the programming current "I"s will naturally flow through the less resistive silicide layer 30 while simultaneously generating increased joule heat near the thin silicide region 32 that rapidly causes a programming break in the silicide layer 30. Once the gap 32' (i.e., a vaporized electromigration break) occurs in the thin silicide region 32, the current will be forced to flow through the underlying polysilicon strip 14 as illustrated in FIG. 13.

Because the sheet resistance of the polysilicon strip 14 can be as high as about 100 $\Omega/\square$, the fuse will respond substantially like a open circuit in its programmed state. It is again noted that the thin silicide region 32 in the fuse structure 40' advantageously assists in consuming substantially less power as well as achieving much more rapid programming times. In addition, because fuse structures are more frequently being used to store highly confidential data, it is very important that the reverse engineering of programmed fuse structures be made as difficult as possible. As described above, the layout geometries of the fuse structures of the present invention are substantially similar to a number of other very common semiconductor device features, which may include for example, transistor gates, device interconnect jumpers, or even metallization routing lines. Therefore, identifying which geometries are or are not fuse structures is advantageously made very laborious and costly.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor fuse structure having a low power programming threshold, comprising:
   a substrate having a field oxide region;
   a polysilicon strip lying over the field oxide region and including an increased dopant concentration region; and
   a silicided metallization layer having first and second regions lying over the polysilicon strip, the first region has a first thickness, and the second region has a second thickness that is less than the first thickness and is positioned substantially over the increased dopant concentration region of the polysilicon strip;
   wherein the semiconductor fuse structure can be programmed by breaking the second region.

2. A semiconductor fuse structure having a low power programming threshold as recited in claim 1, wherein the first region of the silicided metallization layer has a first side and a second side located on opposite sides of the second region.

3. A semiconductor fuse structure having a low power programming threshold as recited in claim 2, wherein the polysilicon strip is substantially rectangular in shape.

4. A semiconductor fuse structure having a low power programming threshold as recited in claim 3, wherein the polysilicon strip has a thickness of between about 1,500 angstroms and about 2,500 angstroms, and has a dopant concentration of between about $1\times10^{19}$ atoms $cm^{-3}$ and about $1\times10^{20}$ atoms $cm^{-3}$.

5. A semiconductor fuse structure having a low power programming threshold as recited in claim 4, wherein the increased dopant concentration region is between about $3\times10^{20}$ atoms $cm^{-3}$ and about $1\times10^{21}$ atoms $cm^{-3}$.

6. A semiconductor fuse structure having a low power programming threshold as recited in claim 4, wherein the second thickness is about half of the first thickness of the silicided metallization layer.

7. A semiconductor fuse structure having a low power programming threshold as recited in claim 6, wherein the first thickness of the silicided metallization layer is between about 350 angstroms and about 650 angstroms, and the second thickness of the silicided metallization is between about 175 angstroms and about 325 angstroms.

8. A semiconductor fuse structure having a low power programming threshold as recited in claim 6, wherein the first thickness of the silicided metallization layer is about 500 angstroms, and the second thickness of the silicided metallization is about 250 angstroms.

9. A semiconductor fuse structure having a low power programming threshold as recited in claim 3, wherein the substantially rectangular shape of the polysilicon strip has a long dimension that is about five times a short dimension.

10. A semiconductor fuse structure having a low power programming threshold as recited in claim 9, wherein the short dimension is between about 1,500 angstroms and about 5,000 angstroms.

11. A semiconductor fuse structure having a low power programming threshold as recited in claim 9, wherein the short dimension is about 2,500 angstroms.

12. A semiconductor fuse structure having a low power programming threshold as recited in claim 11, wherein the long dimension is about 12,500 angstroms.

13. A semiconductor fuse structure having a low power programming threshold as recited in claim 10, wherein the second region of the silicided metallization layer is substantially square having sides equal to the short dimension.

14. A semiconductor fuse structure having a low power programming threshold as recited in claim 13, wherein conductive vias are coupled to a first end and a second end the silicided metallization layer for causing the programming break in the semiconductor fuse structure.

15. A bi-layer semiconductor fuse structure, comprising:
a substrate having a field oxide region;
a polysilicon strip lying over the field oxide region; and
a silicided metallization layer having first and second regions lying over the polysilicon strip, the first region has a first thickness that is approximately centered about the polysilicon strip, and the second region has a second thickness that is about twice that of the first thickness, and the second region is positioned on adjacent sides of the first region.

16. A bi-layer semiconductor fuse structure as recited in claim 15, wherein the polysilicon strip is a doped polysilicon strip that is substantially rectangular in shape.

17. A bi-layer semiconductor fuse structure as recited in claim 16, wherein the substantially rectangular shape of the doped polysilicon strip has a long dimension that is about five times a short dimension.

18. A bi-layer semiconductor fuse structure as recited in claim 17, wherein the short dimension is between about 1,500 angstroms and about 5,000 angstroms.

19. A bi-layer semiconductor fuse structure, comprising:
a polysilicon strip; and
a silicided metallization layer having first and second regions lying over the polysilicon strip, the first region has a first thickness that is approximately centered about the polysilicon strip, and the second region has a second thickness that is about twice as thick as the first thickness, and the second region is positioned on adjacent sides of the first region.

20. A bi-layer semiconductor fuse structure as recited in claim 19, wherein the polysilicon strip is a doped polysilicon strip.

21. A bi-layer semiconductor fuse structure as recited in claim 20, wherein the doped polysilicon strip has a long dimension that is about five times a short dimension of the doped polysilicon strip.

22. A bi-layer semiconductor fuse structure as recited in claim 21, wherein the short dimension is between about 1,500 angstroms and about 5,000 angstroms.

23. A bi-layer semiconductor fuse structure as recited in claims 19, wherein the second thickness of the silicided metallization layer is between about 350 angstroms and about 650 angstroms, and the first thickness of the silicided metallization layer is between about 175 angstroms and about 325 angstroms.

24. A bi-layer semiconductor fuse structure, comprising:
a polysilicon strip; and
a silicided metallization layer having first and second regions lying over the polysilicon strip, the first region has a first thickness that is approximately centered about the polysilicon strip, the second region has a second thickness that is between about 350 angstroms and about 650 angstroms, and the first thickness of the silicided metallization layer is between about 175 angstroms and about 325 angstroms, and the second region is positioned on adjacent sides of the first region.

* * * * *